United States Patent
He

(10) Patent No.: US 8,059,772 B2
(45) Date of Patent: Nov. 15, 2011

(54) FILTER AND METHOD FOR SUPPRESSING EFFECTS OF ADJACENT-CHANNEL INTERFERENCE

(75) Inventor: Shousheng He, Södra Sandby (SE)

(73) Assignee: Telefonaktiebolaget L M Ericcson (publ), Stockholm (SE)

( * ) Notice: Subject to any disclaimer, the term of this patent is extended or adjusted under 35 U.S.C. 154(b) by 645 days.

(21) Appl. No.: 12/093,124

(22) PCT Filed: Nov. 9, 2006

(86) PCT No.: PCT/EP2006/068295
§ 371 (c)(1),
(2), (4) Date: Oct. 1, 2008

(87) PCT Pub. No.: WO2007/054538
PCT Pub. Date: May 18, 2007

(65) Prior Publication Data
US 2009/0135973 A1    May 28, 2009

Related U.S. Application Data

(60) Provisional application No. 60/737,408, filed on Nov. 17, 2005.

(30) Foreign Application Priority Data

Nov. 11, 2005 (EP) .................................. 05024626

(51) Int. Cl.
*H04B 1/10* (2006.01)
(52) U.S. Cl. ........................................................ 375/350
(58) Field of Classification Search .................. 375/350; 708/300, 322
See application file for complete search history.

(56) References Cited

U.S. PATENT DOCUMENTS

| 6,879,649 | B1 * | 4/2005 | Radimirsch et al. | 375/354 |
| 6,952,562 | B1 | 10/2005 | Hantke et al. | |
| 7,729,679 | B1 * | 6/2010 | Lee | 455/295 |
| 2003/0087622 | A1 | 5/2003 | Jayaraman et al. | |
| 2004/0266379 | A1 * | 12/2004 | Woo et al. | 455/188.1 |
| 2008/0298517 | A1 * | 12/2008 | Izumi et al. | 375/344 |

FOREIGN PATENT DOCUMENTS

| EP | 0505867 A | 9/1992 |
| FR | 2871966 A | 12/2005 |
| WO | 99/01945 A1 | 1/1999 |

OTHER PUBLICATIONS

PCT International Search Report, mailed Feb. 12, 2007, in connection with International Application No. PCT/EP2006/68295.
PCT International Preliminary Report on Patentability, mailed Feb. 25, 2008, in connection with International Application No. PCT/EP2006/068295.
Oppenheim, A.V. and R.W. Shafer, "Discrete-Time Signal Processing", Prentice Hall, 1989, p. 180.

* cited by examiner

*Primary Examiner* — Khanh C Tran
(74) *Attorney, Agent, or Firm* — Potomac Patent Group PLLC

(57) ABSTRACT

A filter device and method for suppressing effects of Adjacent-Channel Interference of a received signal in a Frequency-Division-Multiple-Access system by filtering a baseband signal of the received signal. The filter device comprises an interference filter, which is a complex digital Single-Input-Multiple-Output, SIMO, filter that is adapted to simultaneously generate a first signal filtered at an upper-frequency-band and a second signal filtered at a lower-frequency-band, wherein the first signal is separate from the second signal. The filter device also comprises a selector adapted to select one of the signals as the output from the filter device.

21 Claims, 13 Drawing Sheets

SFG

FILTER AND METHOD FOR SUPPRESSING EFFECTS OF ADJACENT-CHANNEL INTERFERENCE

CROSS-REFERENCE TO RELATED APPLICATIONS

This application claims priority under 35 U.S.C. §119 to European Patent Application No. 05024626.3 filed Nov. 11, 2005, which is hereby incorporated herein by reference in its entirety. This application also claims the benefit of U.S. Provisional Application No. 60/737,408, filed Nov. 17, 2005, which is hereby incorporated herein by reference in its entirety.

TECHNICAL FIELD

The present invention generally relates to the field of filters and the filtering of signals. More particularly, the present invention relates to a filter and a method for suppressing effects of Adjacent-Channel Interference of a received signal.

DESCRIPTION OF RELATED ART

In digital time-division multiple-access/frequency-division multiple-access (TDMA/FDMA) communication systems, such as Global System for Mobile Communications (GSM), Enhanced Data for Global Evolution (EDGE), Personal Communications Services (PCS) and Digital Advanced Mobile Phone Services (DAMPS) etc., the performance of radio receivers is normally interference limited. Most interference comes from other users in the same system. The interferences may be Co-Channel Interference (CCI) from other users and/or base stations using the identical carrier frequency as the current user, Adjacent-Channel Interference (ACI) from other users and/or base stations using carrier frequencies adjacent to the current user, etc.

There are different ways of filtering a received signal in digital baseband in order to suppress potential ACI effects of a received signal. Two major approaches for ACI suppression have been suggested. According to a first approach, a symmetrical, narrow band receiver filter is applied to the baseband signal in order to suppress possible ACIs from either an upper or a lower channel, simultaneously. In this regard it is to be noted that due to the sparse nature of ACI, a single side ACI normally dominates the ACI scenario. Thus, a symmetrical narrow band filter, which cuts off frequency components on both the upper frequency band and the lower frequency band side normally damages the desired signal also on the side where ACI is not present or negligible. Consequently, this approach might degrade the receiver performance when no ACI is present or when ACI is negligible. In accordance with a second approach, noise estimation is first made prior to the filtering of the signal for suppressing potential ACI effects. The noise estimation is normally made via channel estimation by utilizing a transmitted signal sequence known as a Training Sequence Code (TSC). Based on the noise estimation, a low order filter can be adaptively obtained, which is then applied to the received signal in order to filter the signal in case there are strong ACIs present. By using this approach it is possible to adaptively suppress ACI, when strong ACI is present. Thereby, the desired signal is normally less damaged as compared to the first approach. However, accurate channel estimation according to the second approach is normally difficult to accomplish. This is especially true in presence of strong interferences or background noise. Inaccurate channel estimation might lead to a difficult adaptive decision whether ACI is present or not. This in turn might lead to degraded receiver performance.

Normally, digital filters, such as Finite Impulse Response (FIR) filters or Infinite Impulse Response (IIR) filters, designed for ACI suppression are computationally complex. A communication device, such as a mobile telephone, having such ACI filter thus normally requires considerable processing power. Consequently, a need remains for an ACI filter which utilizes processing power more efficiently and without damaging the desired signal.

SUMMARY OF THE INVENTION

An object of the present invention is to provide a method and a filter with a reduced processing power requirement.

According to a first aspect, an interference filter for suppressing effects of Adjacent-Channel Interference of a received signal in a Frequency-Division-Multiple-Access system is provided. The interference filter is adapted to filter a baseband signal of the received signal. Furthermore, the interference filter is a complex digital Single-Input-Multiple-Output (SIMO) filter that is adapted to simultaneously generate a first signal (x) filtered at an upper-frequency-band and a second signal (y) filtered at a lower-frequency-band, wherein the first signal (x) is separate from the second signal (y).

The complex digital SIMO filter may have individual frequency responses for the first and second signals. Each individual frequency response may be asymmetrical with regard to the center frequency of the received signal.

The interference filter may be configured with two pairs of interrelated zeros in the complex frequency domain, wherein normalized frequencies of each pair of the interrelated zeros is constrained by a mutually dependent constraint.

The interference filter may have a frequency characteristic according to $$f(z)=(1-e^{j\alpha}z^{-1})(1-e^{j\beta}z^{-1})$$

$$g(z)=(1-e^{-j\alpha}z^{-1})(1-e^{j\beta}z^{-1}),$$

wherein f(z) is the transfer function configured for the filtering in the upper frequency band, and g(z) is the transfer function configured for the filtering in the lower frequency band, and wherein $\alpha,\beta$ and $-\alpha,-\beta$ are the normalized frequencies of the two pairs of interrelated zeros.

The interference filter may be configured for use in a wireless communication device in a Global System for Mobile Communications (GSM) network. Furthermore, the interference filter may be configured for received signals de-rotated by $$\frac{\pi}{2}.$$

The mutually dependent constraint mentioned above may be $$\alpha+\beta=\frac{3}{2}\pi.$$

The interference filter may be configured for use in a wireless communication device in an Enhanced Data for Global Evolution (EDGE) network. The interference filter may be configured for received signals de-rotated by $$\frac{3\pi}{8}.$$

Furthermore, the mutually dependent constraint may be $$\alpha + \beta = \frac{7\pi}{4}.$$

According to a second aspect, a wireless communication device comprising the interference filter according to the first aspect is provided.

According to a third aspect, a filter device comprising the interference filter according to the first aspect is provided. The filter device further comprises a selector adapted to receive the baseband signal, the first signal filtered at the upper frequency band and the second signal filtered at the lower frequency band, and select one of the signals for output based on estimated noise power of each of the signals. The selector may be adapted to estimate noise power levels of the baseband signal, the first signal filtered at the upper frequency band and the second signal filtered at the lower frequency band, compare the respective noise power levels of the signals, and select the signal with the lowest estimated noise power level. Furthermore, the selector may be adapted to estimate the noise power levels by way of a channel estimation utilizing a Training Sequence Code (TSC).

According to a fourth aspect, a wireless communication device comprising the filter device according to the third aspect is provided.

According to a fifth aspect, a method of suppressing effects of Adjacent-Channel Interference of a received signal in a Frequency-Division-Multiple-Access system by filtering a baseband signal of the received signal is provided. The method comprises filtering of the baseband signal at an upper frequency band and a lower frequency band by means of a complex digital Single-Input-Multiple-Output (SIMO) interference filter, and simultaneously generating a first signal filtered at an upper frequency band and a second signal filtered at a lower frequency band, wherein the first signal (x) is separate from the second signal (y).

Each individual frequency response of the upper and lower frequency band filtering may be asymmetrical with regard to the center frequency of the received signal.

The interference filter may be configured with two pairs of interrelated zeros in the complex frequency domain, wherein normalized frequencies of each pair of the interrelated zeros may be constrained by a mutually dependent constraint.

The method may further comprise selecting one of the baseband signal, the first signal filtered at the upper frequency band and the second signal filtered at the lower frequency band. The selecting may comprise estimating noise power levels of the baseband signal, the first signal filtered at the upper band and the second signal filtered at the lower band, comparing the respective noise power levels of said signals, and selecting the signal with the lowest estimated noise power level.

According to a sixth aspect, a computer program product is provided. The computer program product comprises computer program code means for executing the method according to the fifth aspect, when said computer program code means are run by an electronic device having computer capabilities.

Further embodiments of the present invention are defined in the dependent claims.

Embodiments of the invention may allow for a limitation of the required processing power of a filter. The receiver performance of a receiver having a filter according to embodiments of the invention may thus be improved.

It should be emphasized that the term "comprises/comprising" when used herein is taken to specify the presence of stated features, integers, steps or components but does not preclude the presence or addition of one or more other features, integers, steps, components or groups thereof.

BRIEF DESCRIPTION OF THE DRAWINGS

Further objects, features and advantages of the present invention will appear from the following detailed description of embodiments of the invention, reference being made to the accompanying drawings, in which.

DETAILED DESCRIPTION OF EMBODIMENTS

Figure 1:
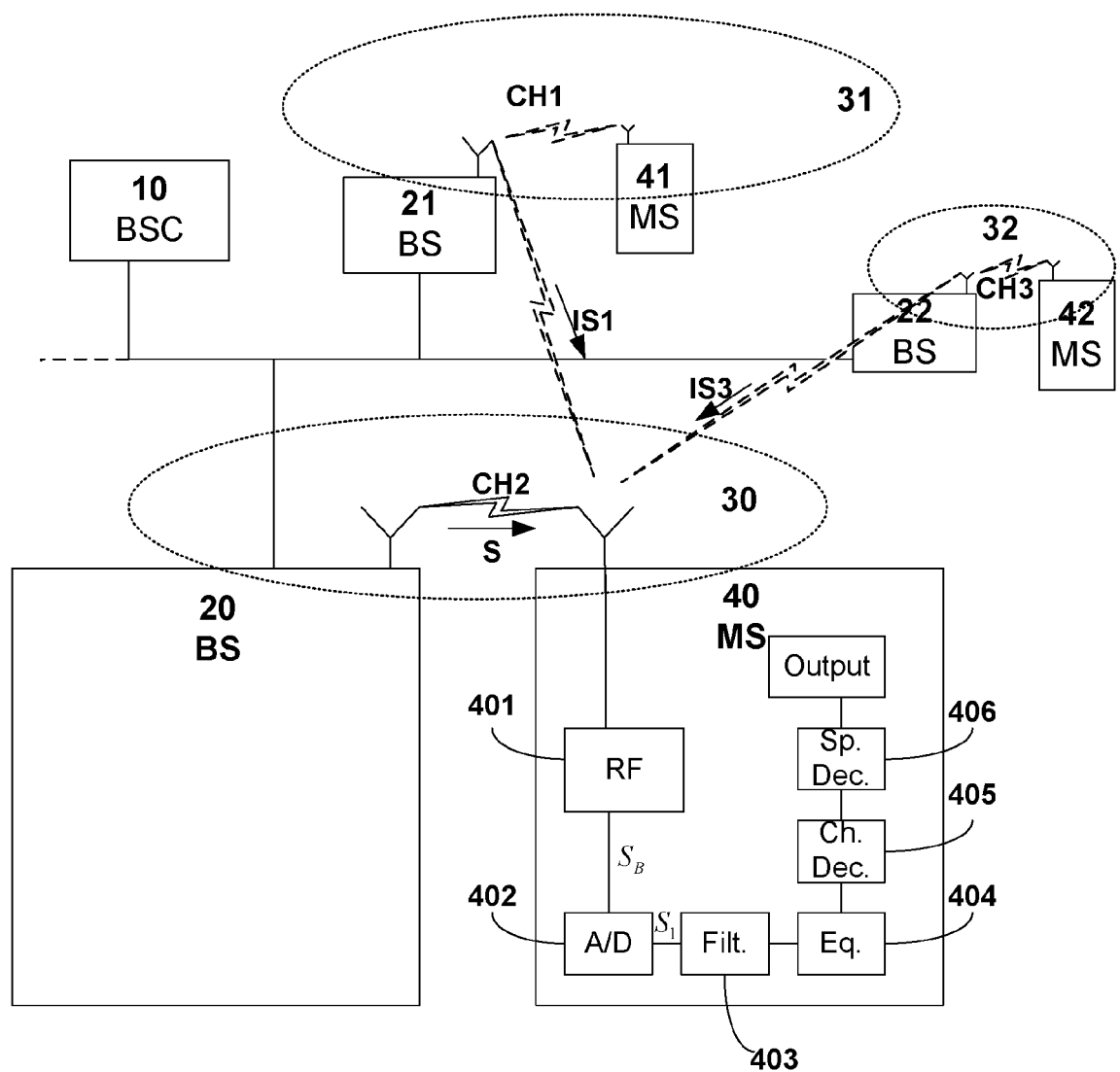
FIG. 1 is an illustration of a mobile station (MS) and a communications network, in which the mobile station (MS) is operating.

FIG. 1 illustrates a communications network in which a filter and a method for suppressing effects of Adjacent-Channel Interference (ACI) of a signal received in a mobile station (MS) according to the present invention may be implemented. The communications network may be a wireless communications network, such as e.g. GSM, EDGE, and UMTS etc. Furthermore, the communications network may comprise several systems such as 2G, 2.5G and 3G. Several of these communications network systems may be overlapping, fully or partly.

As is illustrated in FIG. 1, the communications network typically comprises a plurality of devices connected to each other on the network side. For simplicity only one base station controller BSC 10 and three base stations BS 20, 21, 22 connected to the base station controller BSC 10 are shown.

Each of the base stations forms one or more radio cells 30, 31 or 32 in which case communications with mobile stations MS 40, 41, and 42, respectively, can be set up within the corresponding radio cells.

The mobile stations MS 40, 41, and 42 may be any wireless communication device, such as mobile radio terminals, mobile telephones, cellphones, pagers, communicators, smartphones or the like, herein referred to as mobile stations MS.

As can be seen from FIG. 1, the mobile station MS 40 may comprise, but is not limited to, a radio frequency (RF) receiver unit 401 for receiving and converting radio frequency (RF) signals S including data or information transmitted from the base station BS 20, into low frequency baseband signals $S_B$. The RF receiver unit 401 may, for example, comprise various analog circuits, such as low-noise amplifiers (LNAs), mixers and analog filters. The mobile station MS 40 may further comprise an analog-to-digital converter 402 for converting the analog baseband signals $S_B$ into sampled-data or discrete-time baseband signals $s_1$, a filter device 403, an equalizer 404, a channel decoder 405 and a speech decoder 406, etc.

The mobile station MS 40 may also comprise a memory device. Data instructions or software for various functions of the mobile station MS may be stored in this memory device. Furthermore, the mobile station MS 40 may comprise a Central Processing Unit (CPU) for controlling the operation and function of the mobile station MS.

Figure 2:
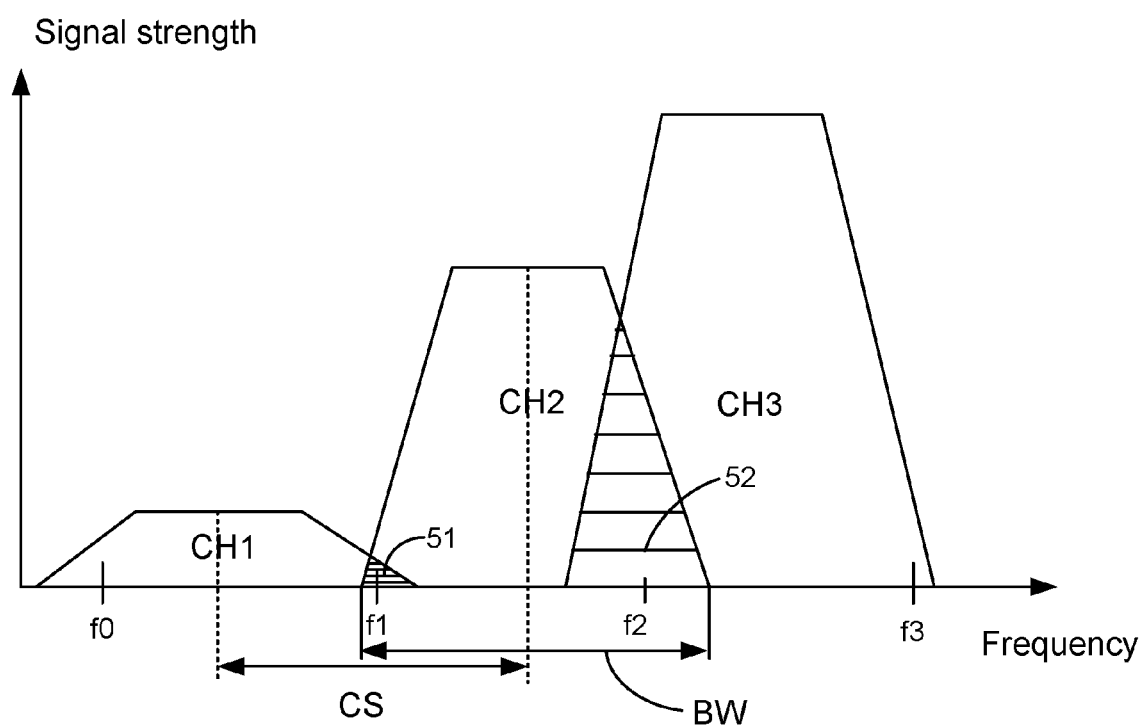
FIG. 2 is a diagram illustrating Adjacent-Channel Interferences.

In the following example, communications are established via a radio interface. The spectrum of the radio interface may be subdivided into a plurality of adjacent frequency bands f0-f1, f1-f2, and f2-f3 as shown in FIG. 2. The individual frequency bands f0-f1, f1-f2, and f2-f3 are assigned to the corresponding radio channels CH1, CH2 and CH3, respectively. In this illustrative example, the radio channels CH1, CH2 and CH3 are assigned within the communications network in such a way that, for example, the radio channel CH2 is available for connections between the base station 20 and the corresponding mobile station 40 in the radio cell 30. For the other base stations 21, 22, etc. having corresponding radio cells 31, 32, etc., other radio channels CH1, CH3, etc. will be allocated.

With reference to FIG. 1, the following description will consider the base station BS 20, and the mobile station MS 40. Signals S including data or information are transmitted via the radio channel CH2 from the base station BS 20. The base station BS 21 is assumed to be the base station transmitting on the channel CH1, which is adjacent to channel CH2, for communication with the mobile station MS 41.

In this example, a transmitted signal S which is the communication over the radio channel CH2 between the base station BS 20 and the mobile station MS 40 is disturbed by interfering signals IS1 on the adjacent radio channel CH1 of the base station BS 21. As can be seen from FIG. 2, the radio channels CH1 and CH2 are adjacent radio frequency channels, so that adjacent-channel interference may be present in the lower frequency band area 51 of the desired radio channel CH2. Similarly, the communication over the radio channel CH2 may be disturbed by other interfering signals IS3 on the radio channel CH3. The signal-to-adjacent interference ratio, that is the ratio between the power of the desired signal and that of adjacent-channel interference, may have significant impact on the performance of the mobile station MS 40, and thus the frequency planning and spectrum efficiency of the communication network. As can be seen from FIG. 2, ACI may occur in the lower frequency end area 51 as well as in the upper frequency end area 52 of the frequency spectrum of the radio channel CH2, as a result of the lower frequency adjacent channel CH1 and the upper frequency adjacent channel CH3, respectively. In this example, the ACI in the lower frequency end area 51 may be negligible. However, the ACI in the upper frequency end area 52 is still very strong.

The filter device 403 may be adapted to perform selective and/or adaptive filtering of the baseband signal $s_1$ of the received signal S in order to suppress effects of Adjacent-Channel Interference of the received signal S.

Figure 3:
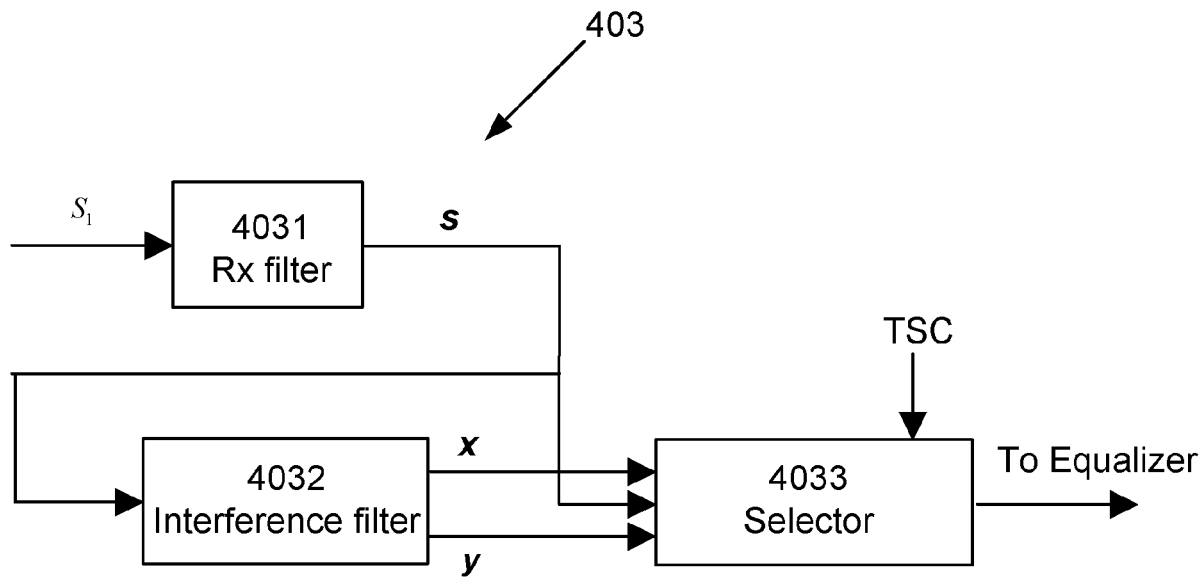
FIG. 3 is a block diagram illustrating an embodiment of a filter device of the mobile station (MS) in FIG. 1.

FIG. 3 illustrates an embodiment of the filter device 403 of the mobile station 40 in FIG. 1. The filter device 403 may comprise a receiver (Rx) filter 4031, such as a low-pass filter, for receiving discrete-time baseband signals $s_1$ which have been generated by way of the analog-to-digital conversion performed by the A/D-converter 402 shown in FIG. 1. It should be appreciated that ACI that appears in the received signal S may propagate through the RF receiver unit 401 and the A/D-converter 402. Hence, any effects of the ACI may still be present in the discrete-time baseband signals $s_1$ that are output from the A/D-converter 402 and subsequently input to the Rx filter 4031 of the filter device 403.

The filter device 403 may comprise an interference filter 4032 for combined or integrated upper and lower frequency band filtering of the received discrete-time baseband signal s, which is the output from the Rx filter 4031. The interference filter 4032 may be a digital filter. As used herein, digital filters refer to the filtering of sampled-data or discrete-time signals.

The interference filter 4032 may, for example, be a digital finite impulse response (FIR) filter, i.e. a filter with only zeros but no poles in the complex (z) domain, such as a low order digital FIR filter. For simplicity reference will herein be made to a FIR filter. This should not, however, be interpreted restrictively but rather as an example. As used herein, the FIR filter operation may be a computational process carried out either by dedicated hardware or by execution of a sequence of instructions by programmable logic. It may also be a combination of hardware and software, or even a computer program product comprising computer program means for executing the computational process. Thereby, an input sequence of numbers is converted by a transfer function into an output sequence of numbers. Transfer functions refer to the frequency characteristics of the digital FIR filter used. Examples of transfer functions may include low-pass, high-pass, band-pass functions, etc. Digital filter computations include digital addition, digital multiplication of signal values by constants, and the insertion of delay stages.

In order to avoid damaging the desired signal at the frequency spectrum side where no ACI presents, an asymmetrical digital $2^{nd}$ order FIR filter, whose frequency response is asymmetrical with regard to the zero-frequency of the baseband signal s (or the center-frequency of the received signal S), is designed for suppressing the effects of ACI at the upper frequency band, i.e. ACI effects from the upper channel CH3, see FIG. 2. This filter with two non-identical zeros may be expressed by the following transfer function in the complex (z) domain:

$$f(z) = (1 - e^{j\alpha}z^{-1})(1 - e^{j\beta}z^{-1}) \qquad (1)$$

$$= 1 - (e^{j\alpha} + e^{j\beta})z^{-1} + e^{j(\alpha+\beta)}z^{-2}$$

$$= 1 + az^{-1} + bz^{-2}$$

Where α and β are the normalized frequencies of two respective zeros, a and b are coefficients of the FIR filter and j is the imaginary operator.

The frequency response may require that the normalized frequencies of two respective zeros lie in the range $$\frac{\pi}{2} < \alpha, \beta < \pi.$$

It has turned out that the zeros of the FIR filter should be exactly on the unit circle to be most effective. Nevertheless, the normalized frequencies α,β of the respective zeros may vary to a certain extent around the frequency boundary between the desired channel CH2 and the upper adjacent channel, CH3. Furthermore, in order to be most efficient the normalized frequencies of the zeros are preferably not identical. One of them may be exactly at the frequency boundary.

According to this embodiment of the invention, a certain constraint is used as a means for improving the computational efficiency of the digital $2^{nd}$ order FIR filter. This mutually dependent constraint can be described by the following expression:

$$\alpha + \beta = n\frac{\pi}{2} \qquad (2)$$

Where α and β are the normalized frequencies of the respective zeros. Given the frequency response requirement above, n could be set to 3, which yields:

$$\alpha + \beta = \frac{3}{2}\pi \qquad (3)$$

When this constraint is applied to the digital $2^{nd}$ order FIR filter it may turn into a relatively simple form having only one non-trivial filter coefficients μ.

The following exemplifies the derivation of the filter coefficients when the constraint is applied to the digital $2^{nd}$ order FIR filter:

$$b = e^{j(\alpha+\beta)} = e^{j(\frac{3}{2}\pi)} = -j$$
$$a = -(e^{j\alpha} + e^{j\beta})$$
$$= -(\cos\alpha + j\sin\alpha + \cos\beta + j\sin\beta)$$
$$= -((\cos\alpha + \cos\beta) + j(\sin\alpha + \sin\beta))$$
$$= -\left(2\cos\left(\frac{\alpha+\beta}{2}\right)\cos\left(\frac{\alpha-\beta}{2}\right) + j2\sin\left(\frac{\alpha+\beta}{2}\right)\cos\left(\frac{\alpha-\beta}{2}\right)\right)$$
$$= -2\cos\left(\frac{\alpha-\beta}{2}\right)\left(\cos\left(\frac{\alpha+\beta}{2}\right) + j\sin\left(\frac{\alpha+\beta}{2}\right)\right)$$
$$= -\sqrt{2}\cos\left(\frac{\alpha-\beta}{2}\right)(-1+j)$$
$$= -\mu(-1+j) = \mu(1-j)$$

Where:

$$\mu = \sqrt{2}\cos\left(\frac{\alpha-\beta}{2}\right)$$

In turn, this yields a transfer function according to the following expression:

$$f(z) = 1 + \mu(1-j)z^{-1} - jz^{-2} \qquad (4)$$

Similarly, when the ACI effects comes from the lower adjacent channel CH1, the normalized frequencies of two respective zeros are at the corresponding negative normalized frequencies, i.e. −α and −β. Thus, by producing a conjugate of the digital $2^{nd}$ order FIR filter expressed in (4), a digital $2^{nd}$ order FIR filter for suppression of ACI effects at the lower frequency band, i.e. ACI effects from the lower channel CH1, see FIG. 2, can be obtained and expressed by the following transfer function:

$$g(z) = f^*(z) = 1 + \mu(1+j)z^{-1} + jz^{-2} \qquad (5)$$

Figure 4:
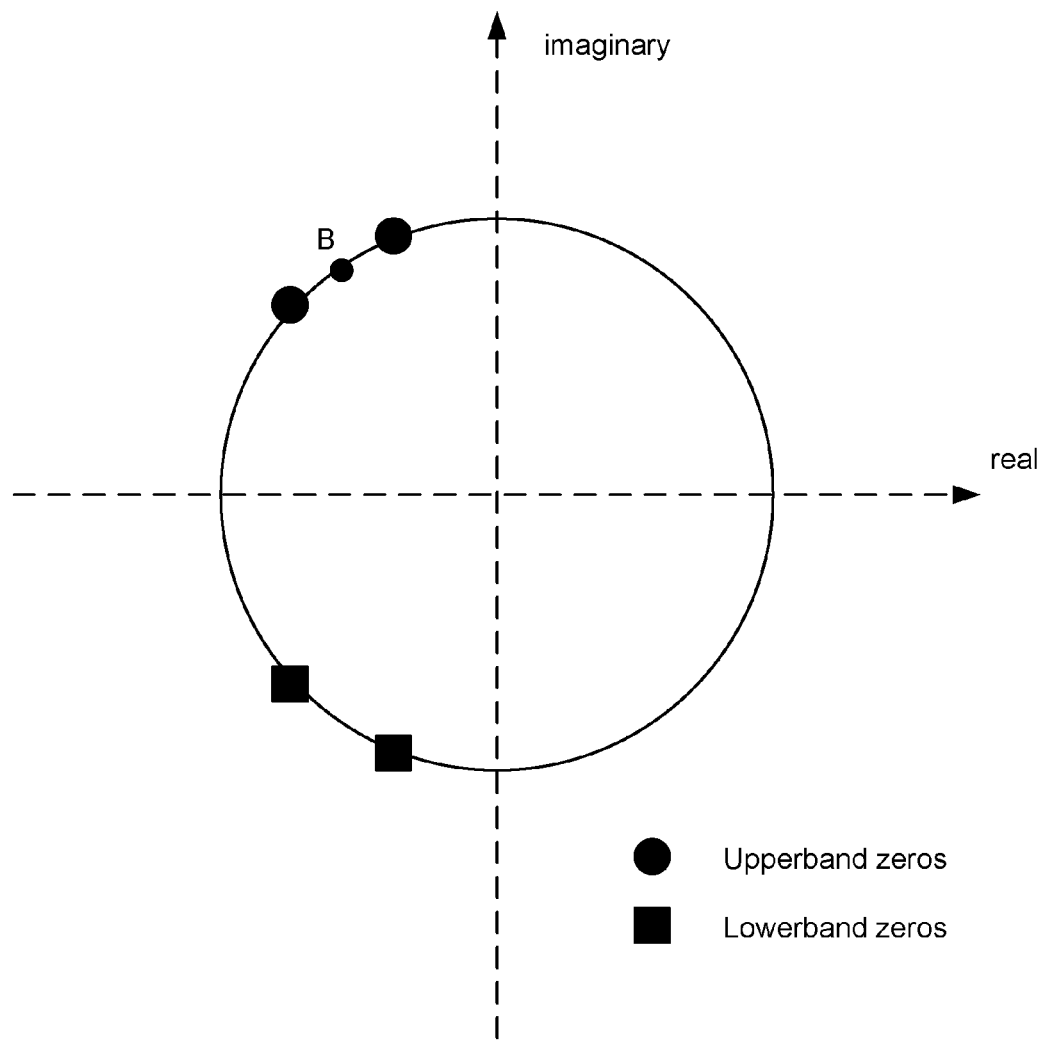
FIG. 4 illustrates possible locations of the normalized four interrelated zeros according to the interference filter in FIG. 3.

FIG. 4 illustrates the locations of the normalized four interrelated zeros in the complex plane, where B represents the normalized frequency boundary. It shows that the normalized zeros of the upper and lower frequency band filters should be exactly on the unit circle to be most effective. Further, it illustrates that the four zeros are paired in a mirrored position, i.e. the zeros for the lower frequency band filter are in the mirrored position of the zeros for the upper frequency band filter about the real axis. Nevertheless, the normalized frequencies of the respective zeros may vary to a certain extent around the normalized frequency boundary B.

The symmetrical nature of the expressions (4) and (5) is such that these two expressions can be advantageously combined or integrated in order to obtain a digital Single-Input-Multiple-Output (SIMO) interference filter 4032. The SIMO interference filter 4032 of this embodiment is capable of simultaneously generating two separate signals, i.e. a first signal x filtered at the upper frequency band and a second signal y filtered at the lower frequency band, wherein the first signal x is separate from the second signal y. Thus, the upper frequency band FIR filter (i.e. expression (4)) and the lower frequency band FIR filter (i.e. expression (5)), can be expressed by:

$$f(z) = 1 + \mu(1-j)z^{-1} + jz^{-2}$$
$$g(z) = 1 + \mu(1+j)z^{-1} + jz^{-2} \qquad (6)$$

Since $$f(z) = \frac{x(z)}{s(z)} \text{ and } g(z) = \frac{y(z)}{s(z)},$$

where x(z), y(z) and s(z) are the output signals of the SIMO interference filter 4032 and received baseband signal represented in complex z-domain, respectively, x and y may be expressed in the time domain by the following expression:

$$x(n) = s(n) + \mu(1-j)s(n-1) - js(n-2)$$
$$y(n) = s(n) + \mu(1+j)s(n-1) + js(n-2) \qquad (7)$$

The relationships between the z-domain and the time domain are described in A. V. Oppenheim and R. W. Shafer, "Discrete-Time Signal Processing", Prentice Hall, 1989, page 180.

Expressions (7) may be expressed in real and imaginary form by:

$$x_r(n) = s_r(n) + \mu s_r(n-1) + \mu s_i(n-1) + s_i(n-2)$$
$$x_i(n) = s_i(n) - \mu s_r(n-1) + \mu s_i(n-1) - s_r(n-2)$$

$y_r(n)=s_r(n)+\mu s_r(n-1)-\mu s_i(n-1)-s_i(n-2)$ $y_i(n)=s_i(n)+\mu s_r(n-1)+\mu s_i(n-1)+s_r(n-2)$ (8)

Where r marks the real part of the complex signal, and i marks the imaginary part of the complex signal. After re-grouping the operations these may be expressed by:

$x_r(n)=(s_r(n)+s_i(n-2))+\mu(s_r(n-1)+s_i(n-1))$ $x_i(n)=(s_i(n)-s_r(n-2))-\mu(s_r(n-1)-s_i(n-1))$ $y_r(n)=(s_r(n)-s_i(n-2))+\mu(s_r(n-1)-s_i(n-1)$ $y_i(n)=(s_i(n)-s_r(n-2))-\mu(s_r(n-1)-s_i(n-1))$ (9)

Figure 5:
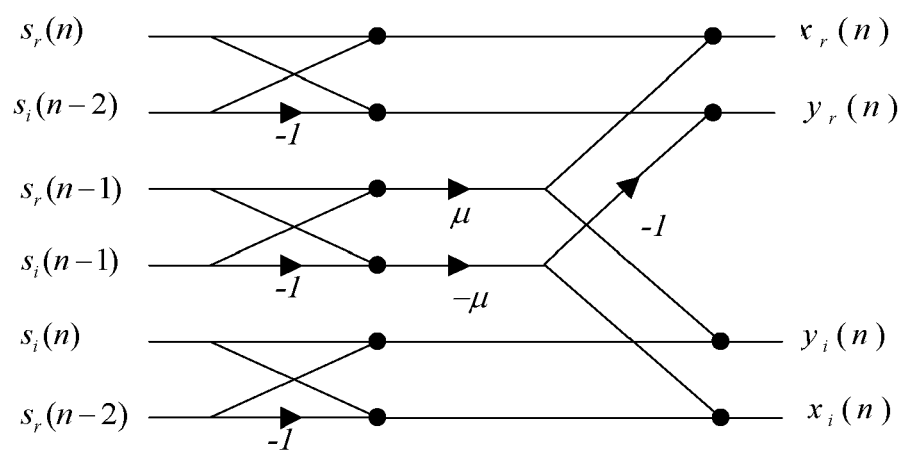
FIG. 5 is a diagram illustrating a signal flow graph (SFG) of the interference filter in FIG. 3.

The expressions (9) can be depicted in a Signal Flow Graph (SFG). The SFG shown in FIG. 5 illustrates that the operational sharing between the upper and lower band signal filtering yields a "butterfly" structure of the digital SIMO interference filter 4032.

In connection with this embodiment of the invention, it should be appreciated that the mutually dependent constraint $$\alpha + \beta = \frac{3}{2}\pi$$

in expression (3) specifies the relationship between the normalized frequencies of the two respective zeros. By choosing $\alpha$ appropriately it is possible to derive $\beta$. Hence, the four interrelated zeros of the transfer function (6) of the SIMO interference filter 4032, i.e. $\alpha$ and $\beta$ for the normalized frequencies of the two respective zeros designed for upper band filtering and $-\alpha$ and $-\beta$ for the normalized frequencies of the two respective zeros designed for lower band filtering, can be found by first defining $\alpha$. However, SIMO interference filters may have different characteristics when $\alpha$ is chosen differently. Consequently, $\alpha$ is not fixed.

Figure 6:
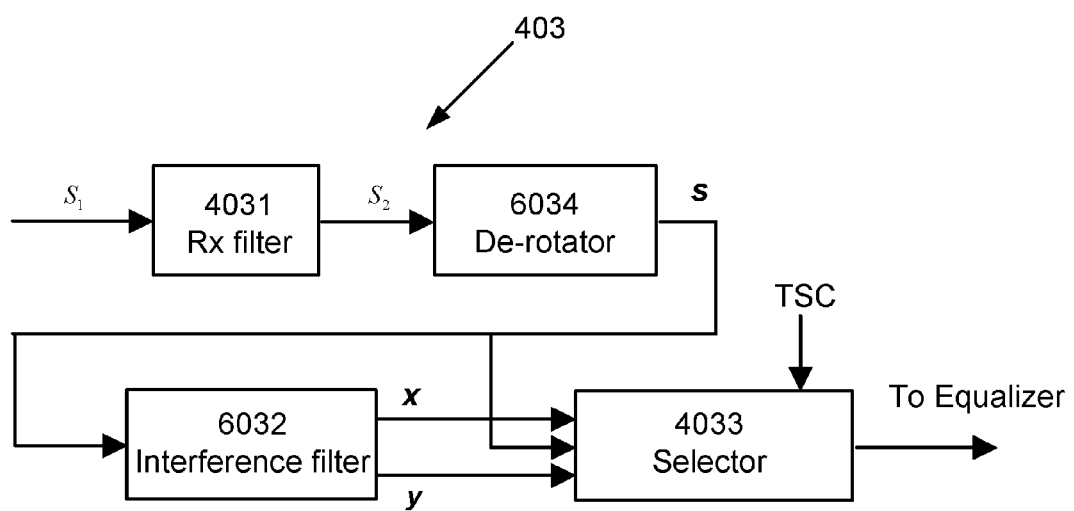
FIG. 6 is a block diagram illustrating another embodiment of a filter device of the mobile station (MS) in FIG. 1.

Another embodiment of the present invention is schematically shown in FIG. 6. The elements in FIG. 6 having corresponding elements in FIG. 3 operate and interact similarly to the description with reference to FIG. 3.

The filter device 403 of FIG. 6 further comprises a de-rotator 6034 for de-rotating a received baseband signal S2, which is the output from the Rx filter 4031. In this embodiment, the filter device is intended for use in a receiver of the mobile station MS 40 in GSM network. When the mobile station MS 40 is intended to demodulate a GMSK (Gaussian Minimum Shift Keying) modulated signal as used in the GSM system, the de-rotator 6034 may e.g. be adapted to de-rotate the received baseband signal S2 by $$\gamma_G = \frac{\pi}{2}.$$

In this case, the asymmetrical digital $2^{nd}$ order FIR filters for suppressing the effects of ACI at the upper and lower frequency band can be expressed as:

$f(z)=(1-e^{j\alpha'}z^{-1})(1-e^{j\beta'}z^{-1})$ $g(z)=(1-e^{-j\alpha'}z^{-1})(1-e^{-j\beta'}z^{-1})$ (10)

Where, f(z) is the transfer function configured for the filtering at the upper frequency band, and g(z) is the transfer function configured for the filtering at the lower frequency band, and $\alpha'=\alpha-\gamma_G, \beta'=\beta-\gamma_G$ $-\alpha'=-\alpha-\gamma_G,-\beta'=-\beta-\gamma_G$ Where, $\alpha', \beta' -\alpha', -\beta'$ are the normalized frequencies of the two pairs of the zeros after de-rotation.

Also in this embodiment, a certain constraint can be used as a means for improving the computational efficiency of the digital $2^{nd}$ order FIR filters in expressions (10). The mutually dependent constraint is $$\alpha' + \beta' = n\frac{\pi}{2},$$

if n is chosen to be n=1, this yields $$\alpha' + \beta' = \frac{\pi}{2}.$$

Thus the mutually dependent constraint can be expressed by:

$$\alpha + \beta = \frac{3}{2}\pi \quad (11)$$

When this constraint is applied to the digital $2^{nd}$ order FIR filters of expressions (10), they also turn into a relatively simple form having only one non-trivial filter coefficient $\mu$.

The following exemplifies the derivation of the filter coefficients when the constraint is applied to the digital $2^{nd}$ order FIR filters.

The expressions (10) can be expressed as:

$f(z)=1+az^{-1}+bz^{-2}$ $g(z)=1+\bar{a}z^{-1}+\bar{b}z^{-2}$ (12)

Where, $$a = -(e^{j\alpha'} + e^{j\beta'})$$
$$= -2\cos\left(\frac{\alpha'-\beta'}{2}\right)\left(\cos\left(\frac{\alpha'+\beta'}{2}\right) + j\sin\left(\frac{\alpha'+\beta'}{2}\right)\right)$$
$$= -2\cos\left(\frac{\alpha-\beta}{2}\right)\left(\cos\left(\frac{\pi}{4}\right) + j\sin\left(\frac{\pi}{4}\right)\right) = -\mu(1+j)$$
$$b = e^{j(\alpha'+\beta')} = e^{j\frac{\pi}{2}} = j$$
$$\bar{a} = -(e^{-j\alpha'} + e^{-j\beta'}) = -(e^{-j(\alpha+\gamma_G)} + e^{-j(\beta+\gamma_G)})$$
$$= -2\cos\left(\frac{\alpha-\beta}{2}\right)\left(\cos\left(\frac{\alpha+\beta+2\gamma_G}{2}\right) - j\sin\left(\frac{\alpha+\beta+2\gamma_G}{2}\right)\right)$$
$$= -2\cos\left(\frac{\alpha-\beta}{2}\right)\left(\cos\left(\frac{5\pi}{4}\right) - j\sin\left(\frac{5\pi}{4}\right)\right) = \mu(1-j)$$
$$\bar{b} = e^{-j(\alpha'+\beta')} = e^{-j\frac{\pi}{2}} = -j$$

And where, $$\mu = \sqrt{2}\cos\left(\frac{\alpha-\beta}{2}\right)$$

Thus, a combined or integrated upper and lower frequency band SIMO interference filter 6032 for use in a receiver of the mobile station in the GSM system can be expressed by:

$$f(z)=1-\mu(1+j)z^{-1}+jz^{-2}$$

$$g(z)=1+\mu(1-j)z^{-1}-jz^{-2} \quad (13)$$

Similarly, since $$f(z) = \frac{x(z)}{s(z)} \text{ and}$$

$$g(z) = \frac{y(z)}{s(z)}$$

it is possible to express the complex output signals x and y, respectively, in the time domain by the following expressions:

$$x(n)=s(n)-\mu(1+j)s(n-1)+js(n-2)$$

$$y(n)=s(n)+\mu(1-j)s(n-1)-js(n-2) \quad (14)$$

In real and imaginary form these may be expressed by:

$$x_r(n)=s_r(n)-\mu s_r(n-1)+\mu s_i(n-1)-s_i(n-2)$$

$$x_i(n)=s_i(n)-\mu s_r(n-1)-\mu s_i(n-1)+s_r(n-2)$$

$$y_r(n)=s_r(n)+\mu s_r(n-1)+\mu s_i(n-1)+s_i(n-2)$$

$$y_i(n)=s_i(n)-\mu s_r(n-1)+\mu s_i(n-1)-s_r(n-2) \quad (15)$$

Where r marks the real part of the complex signal, and i marks the imaginary part of the complex signal. After re-grouping the operations these may be expressed by:

$$x_r(n)=(s_r(n)-s_i(n-2))-\mu(s_r(n-1)-s_i(n-1))$$

$$x_i(n)=(s_i(n)+s_r(n-2))-\mu(s_r(n-1)+s_i(n-1))$$

$$y_r(n)=(s_r(n)+s_i(n-2))+\mu(s_r(n-1)+s_i(n-1))$$

$$y_i(n)=(s_i(n)-s_r(n-2))-\mu(s_r(n-1)-s_i(n-1)) \quad (16)$$

Figure 7:
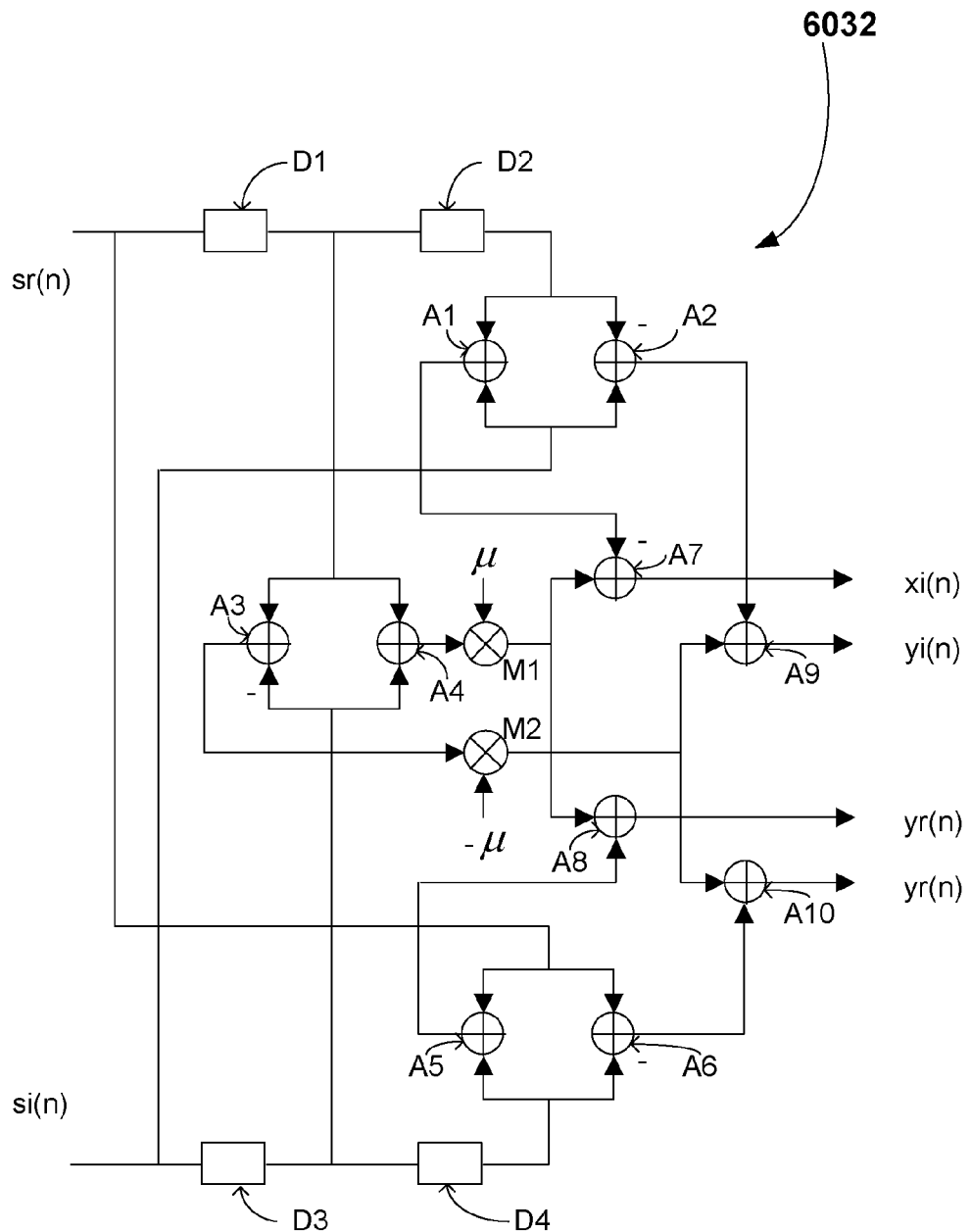
FIG. 7 is a block diagram illustrating an example of a realization of the interference filter in FIG. 6.

FIG. 7 illustrates a block diagram of an example of a realization of the digital SIMO interference filter 6032 in accordance with the expressions (16). As can be seen from this block diagram, the digital SIMO interference filter 6032 may comprise four delay elements D1-D4, ten adder elements A1-A10, and two multiplier elements M1-M2. As can be seen from FIG. 7, only two real multiplications (indicated by M1 and M2) and ten real additions (indicated by A1-A10) per complex sample are required for parallel computation of both upper and lower band filtering. Additionally, with this interference filter 6032 it is possible to get two filtering results in parallel, i.e. one upper band filtering result and one lower band filtering result. In contrast, if the constraint (11) was not applied to the digital FIR filter according to the transfer function (10), it might, for instance, take 8 real multiplications and 10 real additions per sample to get just one filtering result.

Figure 8:
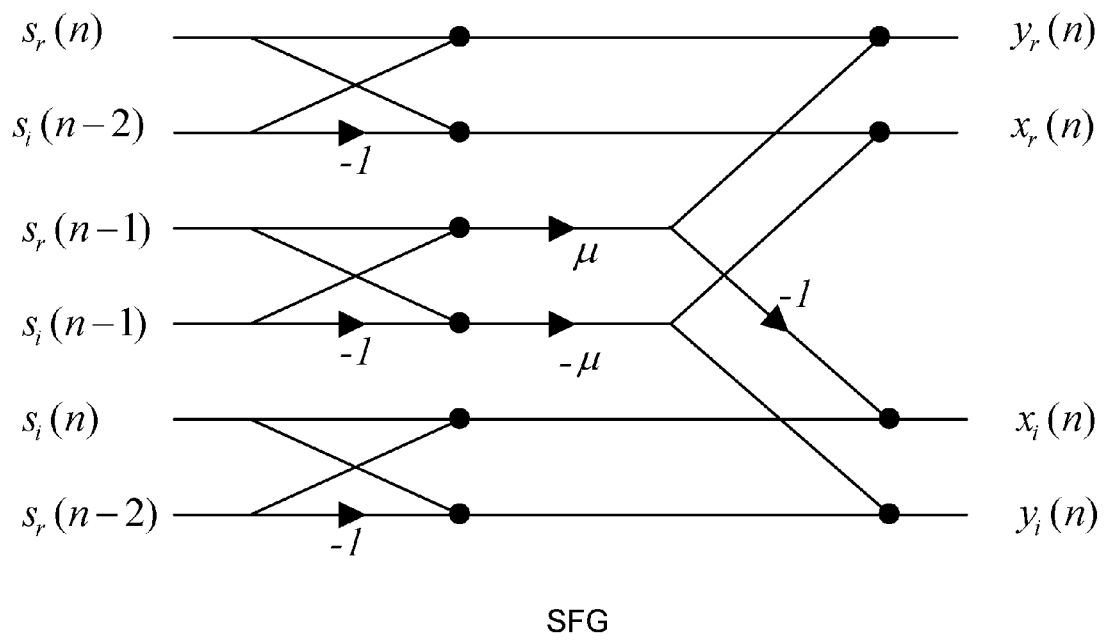
FIG. 8 is a diagram illustrating an SFG of the interference filter in FIGS. 6 and 7.

The expressions (16) may alternatively be depicted in an SFG. The SFG shown in FIG. 8 illustrates again that the operational sharing between the upper and lower band signal filtering yields a "butterfly" structure of the digital SIMO interference filter 6032.

In the GSM system, the bandwidth BW of the desired signal is normally 271 kHz while the channel spacing CS between two adjacent channels is normally about 200 kHz, see FIG. 2. Accordingly, the normalized frequency boundary between the desired channel and the upper/lower adjacent channel is at:

$$\frac{200}{271}\pi \approx \frac{100}{135}\pi.$$

The normalized frequencies of the zeros, i.e. α and β, should be close to the normalized frequency boundary of $$\frac{100}{135}\pi.$$

The mutually dependent constraint $$\alpha + \beta = \frac{3}{2}\pi$$

specifies the relationship between the normalized frequencies of the two respective zeros. By choosing α appropriately it is also possible to derive β. Thus, the four interrelated normalized frequencies of the zeros of the SIMO interference filter 6032, i.e. α and β for upper frequency band and −α and −β for the lower frequency band, can be found by first defining α. For examples, one can choose $$\alpha = \frac{80}{135}\pi, \text{ so } \beta \approx \frac{120}{135}\pi, \text{ or, } \alpha = \frac{90}{135}\pi, \text{ so } \beta \approx \frac{110}{135}\pi.$$

However, α does not need to be fixed and could preferably be tested and evaluated thoroughly in each specific case.

Figure 9:
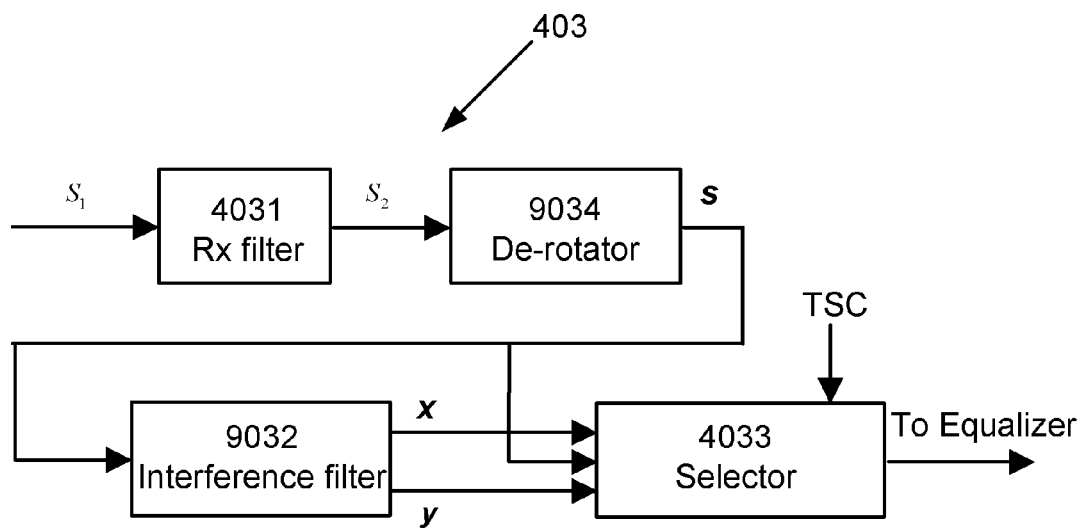
FIG. 9 is a block diagram illustrating yet another embodiment of a filter device of the mobile station (MS) in FIG. 1.

With reference to FIG. 9, yet another embodiment of the present invention is schematically shown. The elements in FIG. 9 having corresponding elements in FIGS. 3 and 6 operate and interact similarly to the description with reference to FIGS. 3 and 6.

In this embodiment, the filter device 403 differs from the filter device previously described with reference to FIG. 6 in that the filter device 403 is intended for use in a receiver of the mobile station 40 in EDGE network. If the received signal is 8-PSK (8-state Phase Shift Keying) modulated, the received signal may be de-rotated by $$\frac{3\pi}{8}$$

by means of a de-rotator 9034. Thus, the de-rotator 9034 in this embodiment may be adapted to de-rotate the received base band signal $s_2$ by $$\gamma_E = \frac{3\pi}{8}$$

when the mobile station MS 40 is intended to demodulate an 8-PSK modulated signal as used in EDGE system.

Once again in this embodiment, a certain constraint can be used as a means for improving the computational efficiency of the digital $2^{nd}$ order FIR filters in expression (10). Due to the de-rotation of $$\gamma_E = \frac{3\pi}{8},$$

let $$\alpha' + \beta' = n\frac{\pi}{2},$$

where $\alpha'=\alpha-\gamma_E$, $\beta'=\beta-\gamma_E$. If n=2, this yields $\alpha'+\beta'=\pi$. Thus the mutually dependent constraint can be expressed by:

$$\alpha + \beta = \frac{7\pi}{4} \quad (17)$$

When this constraint is applied to the digital $2^{nd}$ order FIR filters, they each turn into a relatively simple form having only one non-trivial filter coefficient $\eta$ and $\rho\eta$, respectively.

The following exemplifies the derivation of the filter coefficients when the constraint is applied to the digital $2^{nd}$ order FIR filters:

$$a = -2\cos\left(\frac{\alpha'-\beta'}{2}\right)\left(\cos\left(\frac{\alpha'+\beta'}{2}\right) + j\sin\left(\frac{\alpha'+\beta'}{2}\right)\right) \quad (18)$$

$$= -2\cos\left(\frac{\alpha'-\beta'}{2}\right)\left(\cos\left(\frac{\pi}{2}\right) + j\sin\left(\frac{\pi}{2}\right)\right)$$

$$= -j2\cos\left(\frac{\alpha-\beta}{2}\right) = -j\eta$$

$$b = e^{j(\alpha'+\beta')} = e^{j\pi} = -1$$

$$\bar{a} = -\left(e^{-j\alpha'} + e^{-j\beta'}\right) = -(e^{-j(\alpha+\gamma_E)} + e^{-j(\beta+\gamma_E)})$$

$$= -2\cos\left(\frac{\alpha-\beta}{2}\right)$$

$$\left(\cos\left(\frac{\alpha+\beta+2\gamma_E}{2}\right) - j\sin\left(\frac{\alpha+\beta+2\gamma_E}{2}\right)\right)$$

$$= -2\cos\left(\frac{\alpha-\beta}{2}\right)\left(\cos\left(\frac{5\pi}{4}\right) - j\sin\left(\frac{5\pi}{4}\right)\right) = \rho\eta(1-j)$$

$$\bar{b} = e^{-j(\alpha'+\beta')} = e^{-j\frac{\pi}{2}} = -j$$

Where $\eta = 2\cos\left(\frac{\alpha-\beta}{2}\right)$, $\rho = \frac{\sqrt{2}}{2}$ Thus, a SIMO combined/integrated upper and lower frequency band interference filter 9032 for use in a receiver in the EDGE system can be expressed by:

$$f(z)=1-j\eta z^{-1}-z^{-2}$$

$$g(z)=1+\eta\rho(1-j)z^{-1}-jz^{-2} \quad (19)$$

Since $$f(z) = \frac{x(z)}{s(z)} \text{ and } g(z) = \frac{y(z)}{s(z)},$$

it is possible to express the complex output signals x and y, respectively, in the time domain by the following expression:

$$x(n)=s(n)-j\eta s(n-1)-s(n-2)$$

$$y(n)=s(n)+\eta\rho(1-j)s(n-1)-js(n-2) \quad (20)$$

In real and imaginary form these may be expressed by:

$$x_r(n)=s_r(n)+\eta s_i(n-1)-s_r(n-2)$$

$$x_i(n)=s_i(n)-\eta s_r(n-1)-s_i(n-2)$$

$$y_r(n)=s_r(n)+\rho(\eta s_r(n-1)+\eta s_i(n-1))+s_i(n-2)$$

$$y_i(n)=s_i(n)-\rho(\eta s_r(n-1)-\eta s_i(n-1))-s_r(n-2) \quad (21)$$

Where r marks the real part of the complex signal, and i marks the imaginary part of the complex signal. After re-grouping the operations these may be expressed by:

$$x_r(n)=(s_r(n)-s_r(n-2))+\eta s_i(n-1)$$

$$x_i(n)=(s_i(n)-s_i(n-2))-\eta s_r(n-1)$$

$$y_r(n)=(s_r(n)+s_i(n-2))+\rho(\eta s_i(n-1)+\eta s_r(n-1))$$

$$y_i(n)=(s_i(n)-s_r(n-2))+\rho(\eta s_i(n-1)-\eta s_r(n-1)) \quad (22)$$

Figure 10:
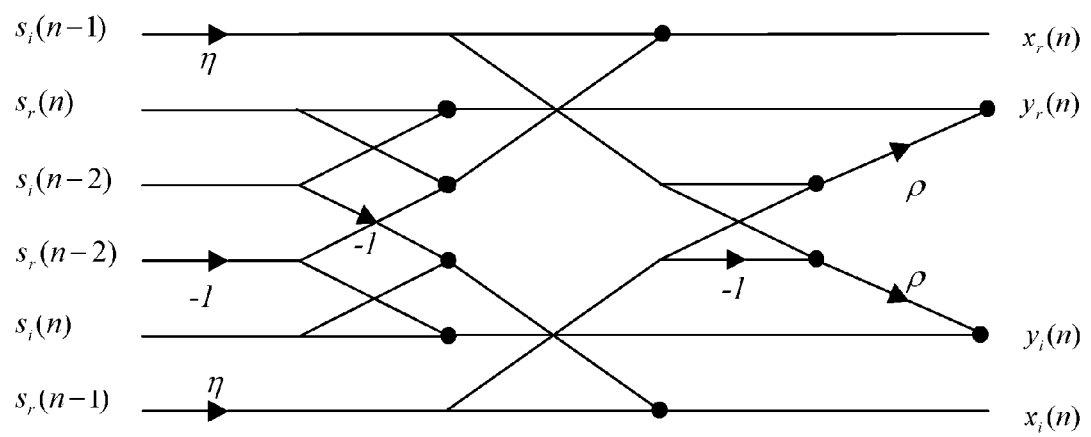
FIG. 10 is a diagram illustrating an SFG of the interference filter in FIG. 9.

The expressions (22) can be depicted in a SFG. The SFG shown in FIG. 10 illustrates the operational sharing between the upper and lower band filtering that is provided by the SIMO interference filter 9032 according to this embodiment.

Again, the mutually dependent constraint $$\alpha + \beta = \frac{7}{4}\pi$$

specifies the relationship between the normalized frequencies of the two respective zeros. When the SIMO interference filter 9032 is intended for use in a receiver in the EDGE system it may be advantageous to choose, for example, $$\alpha = \frac{110}{135}\pi, \text{ so } \beta \approx \frac{125}{135}\pi.$$

Figure 11:
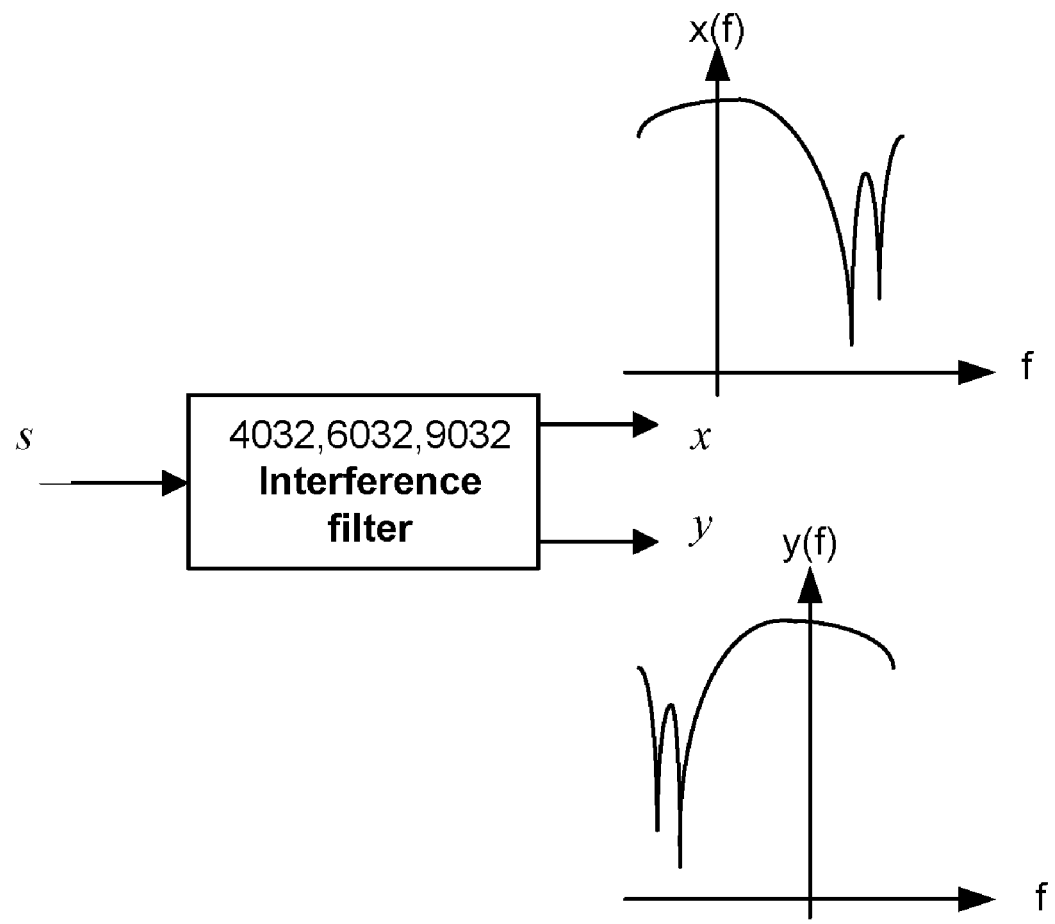
FIG. 11 illustrates typical characteristics of the interference filter in FIGS. 3, 5 and 8.

FIG. 11 shows typical characteristics of the SIMO interference filter with one input signal s and two output signals x, y according to embodiments of the interference filter 4032, 6032 and 9032. As is illustrated, the interference filter generates simultaneously two separate signals, i.e. a first signal x filtered at an upper frequency band and a second separate signal y filtered at a lower frequency band, wherein the first signal is separate from the second signal. Furthermore the frequency responses of the upper frequency band filter and the lower frequency band filter are asymmetrical with regard to the center frequency of the received signal. This makes it possible to avoid damaging the desired signal while suppressing ACI.

As is mentioned above for all embodiments of the invention, the significant operational sharing of the SIMO interference filter 4032, 6032 and 9032 is an advantage, because it requires few digital multiplications and additions per complex sample. Thus, it makes it possible to suppress potential ACI effects from adjacent channels CH1 and CH3 without excessive computational complexity and associated power consumption. In conclusion, it is possible to provide a SIMO interference filter for suppressing ACI effects that is computationally efficient and at the same time not damaging the desired signal.

The filter device 403 may further comprise a selector 4033. In the embodiment with reference to FIG. 3, the selector 4033 may be adapted to receive the baseband signal s that is output from the Rx filter 4031. In the embodiment with reference to FIG. 6, the selector 4033 may be adapted to receive the baseband signal s that is output from the de-rotator 6034. In the embodiment with reference to FIG. 9, the selector 4033 may be adapted to receive the baseband signal s that is output from the de-rotator 9034. Furthermore, the selector 4033 may be adapted to receive the upper band filtered signal x, and the lower band filtered signal y, respectively, that are outputs from the SIMO interference filter 4032, 6032 or 9032. Also, the selector 4033 is adapted to select one of the signals for further processing, e.g. based on noise estimation, once the selector has received these signals. As one example, the noise estimation may be performed in such a way that the noise energy of the baseband signal s, the upper band filtered signal x, and the lower band filtered signal y, respectively, are each estimated by the selector 4033. The estimation of the noise energy may, for example, be performed by channel estimation utilizing a transmitted Training Sequence Code TSC that is known to the selector 4033. Thereafter, the signal with the lowest estimated noise power level may be selected by the selector 4033 to be output. Subsequently, the output from the filter device 403 will be input to the equalizer 404. Hence, an adaptive scheme for ACI rejection may be obtained.

In short, when there is no ACI present the selector 4033 may select the received complex baseband signal s without unnecessarily damaging the received baseband signal. When the received baseband signal is disturbed by the upper channel CH3, the upper band filtered complex signal x is subsequently selected by the selector 4033. However, when the received baseband signal is disturbed by the lower channel CH1, the lower band filtered complex signal y is selected by the selector to be input to the equalizer. In other words, the selector 4033 may select any of the signals s, x, or y, wherein s has not been suppressed, x and y have been suppressed, as an output from the filter device 403.

Since the selection by the selector 4033 is not only based on the received complex base band signal s but also on the filtering results x, y from the combined/integrated asymmetrical upper and lower frequency band filtering in the SIMO interference filter 4032, 6032 or 9032, it is possible to avoid unnecessarily damaging or impairing the desired baseband signal on the frequency side where no ACI is present or where ACI is negligible. Since the accuracy of the noise estimation relies on the accuracy of the channel estimation, the channel estimation according to embodiments of the invention is made after the ACI suppression, the impact of ACI is minimized. Compared to the second ACI suppressing approach described in the Description of Related Art, wherein the channel/noise estimation is made before the ACI suppression, the accuracy of channel/noise estimation in the embodiments of the invention is improved. This in turn leads to an easier adaptive decision for the filter device 403 in selecting the signal for further processing. Thus, the receiver performance in both sensitivity channel and ACI interference channel may be improved.

Figure 12:
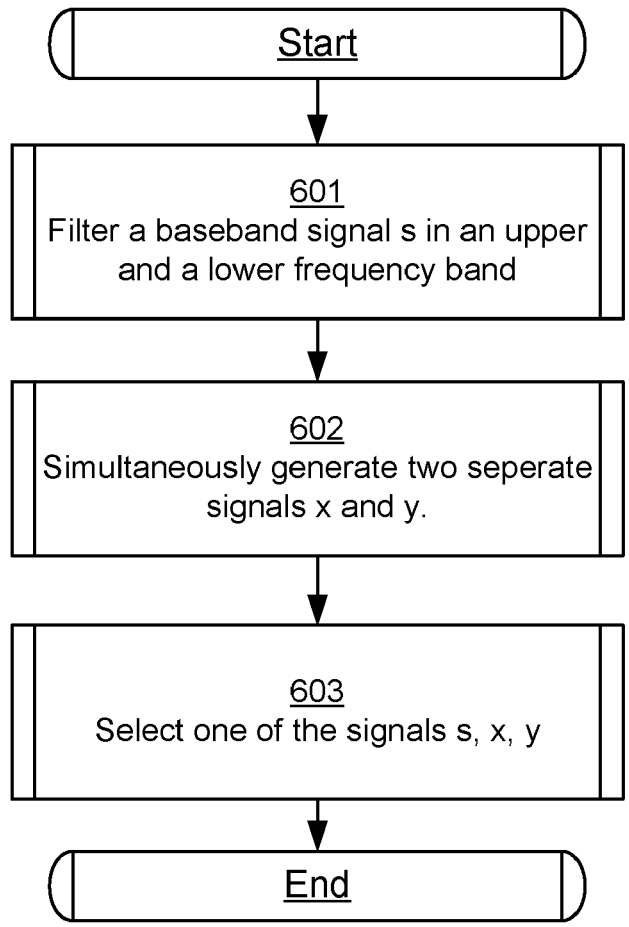
FIG. 12 is a flow chart illustrating an embodiment of a method for suppressing effects of Adjacent-Channel Interference of a received signal.

FIG. 12 illustrates an embodiment of a method for suppressing effects of ACI of a received signal S. In step 601, a digital baseband signal s of the received signal S is filtered at an upper frequency band and a lower frequency band, respectively. A first signal x filtered at the upper frequency band and a second signal y filtered at the lower frequency band, wherein the first signal is separate from the second signal, are simultaneously generated in step 602. For example, the steps 601 and 602 may be performed by means of the SIMO interference filter 4032, 6032 or 9032 according to any of the embodiments described above. In a further step 603, a selection between the baseband signal s and the two separate signals x, y generated in step 602 may be performed.

Figure 13:
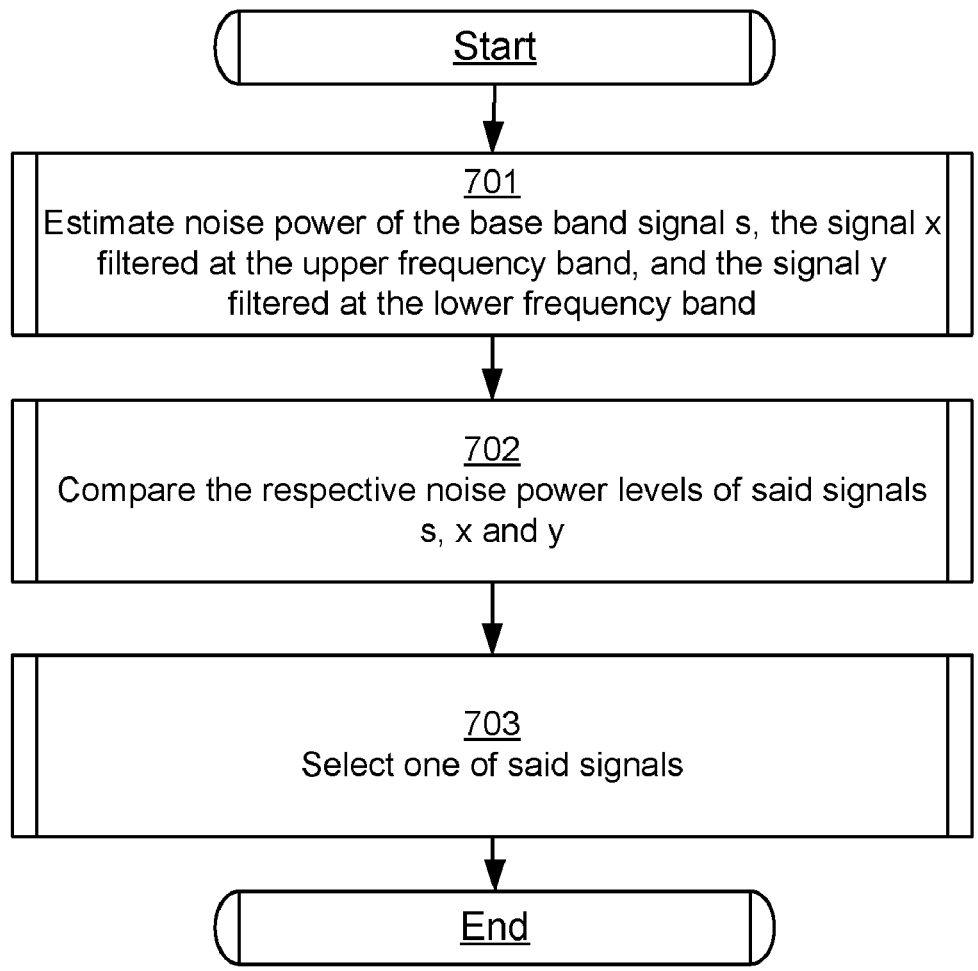
FIG. 13 is a flow chart illustrating an embodiment of a method for performing the selection step in FIG. 12.

FIG. 13 illustrates an embodiment of a method for performing the selection step 603 in FIG. 12. As is illustrated, the selection comprises estimating noise power levels of the baseband signal s, the separate signal x filtered at the upper frequency band and the separate signal y filtered at the lower frequency band in step 701. Furthermore, it comprises comparing the respective noise power levels of said signals in step 702, and in response thereto selecting the signal with the lowest noise power level for the further processing in step 703. The selection shown in FIG. 13 may e.g. be performed by means of the selector 4033 as described above.

The method shown in FIGS. 12 and 13 may, for example, be performed by means of the filter device 403, as described above.

The present invention may be embedded in a computer program product, which enables implementation of the method and functions described above. The invention may be carried out when the computer program product is loaded and run in an apparatus having computer capabilities, such as a processor. Computer program, software program, program product, or software, in the present context mean any expression, in any programming language, code or notation, of a set of instructions intended to cause a system having a processing capability to perform a particular function directly or after conversion to another language, code or notation. Furthermore, the computer program product may be stored on a computer readable medium.

It is an advantage with the present invention that it provides an efficient utilization of the required processing power of a filter. Furthermore, it is an advantage with the present invention that it may provide efficient ACI suppression without excessive computational complexity and damaging the desired signals. Hence, it is an advantage that embodiments of the invention enable improvement of the operation performance of a mobile station, such as e.g. a mobile telephone. Furthermore, due to improved accuracy of the noise estimation according to embodiments of the invention, it has been shown in simulations that these embodiments of the invention may provide improved operation performance of a mobile station for radio channel profiles of typical urban and hilly terrain.

Although the present invention has been described with reference to specific embodiments, it is not intended to be limited to the specific form set forth herein. Other embodiments than the above described are equally possible within the scope of the invention.

The invention claimed is:

1. An interference filter for suppressing effects of Adjacent-Channel Interference of a received signal in a Frequency-Division-Multiple-Access system, wherein the interference filter is adapted to filter a baseband signal of the received signal, wherein the interference filter is a complex digital Single-Input-Multiple-Output, SIMO, filter that is adapted to simultaneously generate a first signal filtered at an upper-frequency-band and a second signal filtered at a lower-frequency-band by means of operational sharing between upper and lower band signal filtering that yields a butterfly structure, wherein the first signal is separate from the second signal.

2. The interference filter according to claim 1, wherein the complex digital SIMO filter has individual frequency responses for the first and second signals, and wherein each individual frequency response is asymmetrical with regard to the center frequency of the received signal.

3. The interference filter according to claim 1, wherein the interference filter is configured with two pairs of interrelated zeros in the complex frequency domain, wherein normalized frequencies of each pair of the interrelated zeros is constrained by a mutually dependent constraint.

4. The interference filter according to claim 3, wherein the interference filter has a frequency characteristic according to $$f(z)=(1-e^{j\alpha}z^{-1})(1-e^{j\beta}z^{-1})$$

$$g(z)=(1-e^{-j\alpha}z^{-1})(1-e^{-j\beta}z^{-1}),\text{ wherein}$$

f(z) is the transfer function configured for the filtering in the upper frequency band, and g(z) is the transfer function configured for the filtering in the lower frequency band, and wherein $\alpha,\beta$ and $-\alpha,-\beta$ are the normalized frequencies of the two pairs of interrelated zeros.

5. The interference filter according to claim 4, wherein the interference filter is configured for use in a wireless communication device in a Global System for Mobile Communications network.

6. The interference filter according to claim 4, wherein the interference filter is configured for received signals de-rotated by $$\frac{\pi}{2}.$$

7. The interference filter according to claim 4, wherein the mutually dependent constraint is $$\alpha+\beta=\frac{3}{2}\pi.$$

8. The interference filter according to claim 4, wherein the interference filter is configured for use in a wireless communication device in an Enhanced Data for Global Evolution network.

9. The interference filter according to claim 4, wherein the interference filter is configured for received signals de-rotated by $$\frac{3\pi}{8}.$$

10. The interference filter according to claim 4, wherein the mutually dependent constraint is $$\alpha+\beta=\frac{7\pi}{4}.$$

11. A wireless communication device comprising the interference filter according to claim 1.

12. A filter device comprising the interference filter according to claim 1, further comprising a selector adapted to receive the baseband signal, the first signal filtered at the upper frequency band and the second signal filtered at the lower frequency band, and select one of the signals for output based on estimated noise power of each of the signals.

13. The filter device according to claim 12, wherein the selector is adapted to estimate noise power levels of the baseband signal, the first signal filtered at the upper frequency band and the second signal filtered at the lower frequency band, compare the respective noise power levels of the signals, and select the signal with the lowest estimated noise power level.

14. The filter device according to claim 13, wherein the selector is adapted to estimate the noise power levels by way of a channel estimation utilizing a Training Sequence Code (TSC).

15. A wireless communication device comprising the filter device according to claim 12.

16. A method of suppressing effects of Adjacent-Channel Interference of a received signal in a Frequency-Division-Multiple-Access system by filtering a baseband signal of the received signal comprising:
   filtering of the baseband signal at an upper frequency band and a lower frequency band, by a complex digital Single-Input-Multiple-Output, SIMO, interference filter; and
   simultaneously generating a first signal filtered at an upper frequency band and a second signal filtered at a lower frequency band by means of operational sharing between the upper and lower band signal filtering that yields a butterfly structure, wherein the first signal is separate from the second signal.

17. The method according to claim 16, wherein each individual frequency response of the upper and lower frequency band filtering is asymmetrical with regard to the center frequency of the received signal.

18. The method according to claim 16, wherein the interference filter is configured with two pairs of interrelated zeros in the complex frequency domain, wherein normalized frequencies of each pair of the interrelated zeros is constrained by a mutually dependent constraint.

19. The method according to claim 16, further comprising:
   selecting one of the baseband signal, the first signal filtered at the upper frequency band and the second signal filtered at the lower frequency band.

20. The method according to claim 19, wherein the step of selecting comprises:
   estimating noise power levels of the baseband signal, the first signal filtered at the upper band and the second signal filtered at the lower band;
   comparing the respective noise power levels of said signals, and selecting the signal with the lowest estimated noise power level.

21. A nontransitory computer readable storage medium comprising computer program code means for executing a method of suppressing effects of Adjacent-Channel Interference of a received signal in a Frequency-Division-Multiple-Access system by filtering a baseband signal of the received signal when said computer program code means are run by an electronic device having computer capabilities, the method comprising:
   filtering of the baseband signal at an upper frequency band and a lower frequency band, by a complex digital Single-Input-Multiple-Output, SIMO, interference filter; and
   simultaneously generating a first signal filtered at an upper frequency band and a second signal filtered at a lower frequency band by means of operational sharing between the upper and lower band signal filtering that yields a butterfly structure, wherein the first signal is separate from the second signal.

* * * * *

UNITED STATES PATENT AND TRADEMARK OFFICE
CERTIFICATE OF CORRECTION

PATENT NO.        : 8,059,772 B2
APPLICATION NO.   : 12/093124
DATED             : November 15, 2011
INVENTOR(S)       : He It is certified that error appears in the above-identified patent and that said Letters Patent is hereby corrected as shown below:

On the Title Page, in Item (73), under "Assignee", delete "Ericcson" and insert -- Ericsson --, therefor.

In Column 2, Line 43, delete " $(1-e^{j\beta}z^{-1}),$ " and insert -- $(1-e^{-j\beta}z^{-1}),$ --, therefor.

In Column 4, Line 44, delete "8." and insert -- 8, --, therefor.

In Column 7, Line 40, delete "coefficients" and insert -- coefficient --, therefor.

In Column 8, Line 40, in Equation (6), delete " $+\mu(1-j)z^{-1}+jz^{-2}$ " and insert -- $+\mu(1-j)z^{-1}-jz^{-2}$ --, therefor.

In Column 9, Line 13, in Equation (9), delete " $y_r(n)=(s_r(n)-s_i(n-2))+\mu(s_r(n-1)-s_i(n-1))$
$y_i(n)=(s_i(n)-s_r(n-2))-\mu(s_r(n-1)-s_i(n-1))$ "

and insert -- $y_r(n) = (s_r(n) - s_i(n-2)) + \mu(s_r(n-1) - s_i(n-1))$
$y_i(n) = (s_i(n) + s_r(n-2)) + \mu(s_r(n-1) + s_i(n-1))$ --, therefor.

In Column 10, Line 7, delete " $\alpha', \beta'$ -$\alpha', $-$\beta'$ " and insert -- $\alpha', \beta', -\alpha', -\beta'$ --, therefor.

Signed and Sealed this
Twenty-fourth Day of July, 2012

David J. Kappos
*Director of the United States Patent and Trademark Office*

CERTIFICATE OF CORRECTION (continued)
U.S. Pat. No. 8,059,772 B2

In Column 13, Lines 35-37, in Equation (18), delete "
$$-2\cos(\frac{\alpha'-\beta'}{2})(\cos(\frac{\pi}{2})+j\sin(\frac{\pi}{2}))$$
$$-j2\cos(\frac{\alpha-\beta}{2})=-j\eta$$
"

and insert --
$$=-2\cos(\frac{\alpha'-\beta'}{2})(\cos(\frac{\pi}{2})+j\sin(\frac{\pi}{2}))$$
$$=-j2\cos(\frac{\alpha-\beta}{2})=-j\eta$$
--, therefor.